United States Patent [19]
Walpita et al.

[11] Patent Number: 5,962,122
[45] Date of Patent: Oct. 5, 1999

[54] LIQUID CRYSTALLINE POLYMER COMPOSITES HAVING HIGH DIELECTRIC CONSTANT

[75] Inventors: Lak M. Walpita, Bedminster; William M. Pleban, Manville; Helmut Eckhardt, Madison, all of N.J.

[73] Assignee: Hoechst Celanese Corporation, Somerville, N.J.

[21] Appl. No.: 08/563,473

[22] Filed: Nov. 28, 1995

[51] Int. Cl.⁶ .............................. B32B 18/00; C08K 5/00
[52] U.S. Cl. ........................ 428/325; 524/81; 524/174; 524/176; 524/177; 524/178; 524/183; 524/261; 524/401; 524/404; 524/408; 524/413; 524/442; 524/445; 524/449; 524/451; 524/539; 524/540; 428/327; 428/339; 428/402; 428/441.1; 428/412; 428/457; 428/480; 428/689
[58] Field of Search .......................... 524/81, 174, 176, 524/177, 178, 183, 261, 401, 404, 408, 413, 442, 445, 449, 451, 539, 540; 428/325, 327, 339, 402, 411.1, 412, 457, 480, 689

[56] References Cited

U.S. PATENT DOCUMENTS

| | | | |
|---|---|---|---|
| 4,335,180 | 6/1982 | Traut et al. | 428/303 |
| 4,798,863 | 1/1989 | Leland et al. | 524/413 |
| 4,845,062 | 7/1989 | Burn | 501/136 |
| 5,154,973 | 10/1992 | Imagawa et al. | 428/325 |
| 5,162,977 | 11/1992 | Paurus et al. | 361/401 |
| 5,358,775 | 10/1994 | Horn et al. | 428/209 |
| 5,469,324 | 11/1995 | Henderson et al. | 361/301.2 |
| 5,552,210 | 9/1996 | Horn et al. | 428/209 |

FOREIGN PATENT DOCUMENTS

| | | |
|---|---|---|
| 0 747 422 A2 | 12/1996 | European Pat. Off. . |
| 3242657 | 5/1983 | Germany . |
| 56-149711 | 11/1981 | Japan . |
| 58-141222 | 8/1983 | Japan . |
| 58-149928 | 9/1983 | Japan . |
| 63-063728 | 3/1988 | Japan . |
| 63-264662 | 11/1988 | Japan . |
| 63-264671 | 11/1988 | Japan . |
| 1-245059 | 9/1989 | Japan . |
| 2-302450 | 12/1990 | Japan . |
| 5-001229 | 6/1991 | Japan . |
| 4-161461 | 6/1992 | Japan . |
| 5-57853 | 3/1993 | Japan . |
| 5-98069 | 4/1993 | Japan . |
| 5-291820 | 11/1993 | Japan . |
| 5-307911 | 11/1993 | Japan . |
| 5-311010 | 11/1993 | Japan . |
| 6-216482 | 8/1994 | Japan . |
| 7-162111 | 6/1995 | Japan . |
| WO 92/18213 | 10/1992 | WIPO . |

OTHER PUBLICATIONS

PATENT ABSTRACTS OF JAPAN, vol. 014, No. 106 (C–0694), Feb. 27, 1990 & JP 01 311172 A (NIPPON PETROCHEM CO LTD), Dec. 15, 1989.

CHEMICAL PATENTS INDEX, DOCUMENTATION ABSTRACTS JOURNAL, Sec. Ch, Week 9616, May 26, 1996, Derwent Pub. Ltd., London, GB; Class A85, AN 96–157193, XP002026174 & JP 08 041 247 A (OTSUKA KAGAKU YAKUHIN KK), Feb. 13, 1996.

S. ASAI, et al., "Fabrication of an Insulated Metal Substrate having an Insulating layer with a High Dilectric Constant" IEEE Transactions on Components, Hybrids and Manufacturing Technology, vol. 16, No. 5, Aug. 1993, pp. 499–504.

*Primary Examiner*—Samuel A. Acquah
*Attorney, Agent, or Firm*—Burns, Doane, Swecker & Mathis, L.L.P.

[57] ABSTRACT

Polymeric compositions having a high dielectric constant are made from a thermotropic liquid crystalline and a ceramic having a dielectric constant which is greater than about 50 at a frequency of 1.0 GHz. The compositions have a dielectric constant of at least about 4, and preferably at least about 6. Preferred compositions also have a low loss tangent.

23 Claims, No Drawings

LIQUID CRYSTALLINE POLYMER COMPOSITES HAVING HIGH DIELECTRIC CONSTANT

FIELD OF THE INVENTION

This invention relates generally to the field of materials having a high dielectric constant, and more particularly to composite materials comprising liquid crystalline polymers and ceramic fillers that have high dielectric constants and low loss tangents.

BACKGROUND OF THE INVENTION

New materials with high dielectric constants are needed in the electronics industry for applications at high frequencies (above about 500 MHz) to enable further miniaturization. These are particularly useful if they can be molded into flat sheets or thin films for such uses as circuit boards at microwave frequencies, high energy density capacitors, filters, antennas, buried components and multichip modules. A low loss tangent is also important to reduce noise and signal attenuation in high frequency circuits. These materials have a variety of potential end uses, especially in wireless communications. Certain ceramic materials have the desired high dielectric constant and low loss tangent, but they are not readily made into sheets. Ceramic materials are also brittle.

One approach to making sheets and other shaped components with the desired properties is to utilize a composition comprising a polymeric matrix and a ceramic filler with a high dielectric constant. Such compositions are often referred to as "composites," and are referred to herein as composites or high dielectric composites or compositions. A high level of ceramic filler is needed to make a composite that has a high dielectric constant. It is important that these highly filled composites be readily fabricated, as by injection molding. The composites must also be stable to changes in ambient moisture (humidity) and temperature. Resistance to elevated temperatures, high mechanical strength, impact resistance, and chemical resistance are also desirable. Finally, in many applications, sheets and films of these materials will need to be made into laminates with copper and/or other materials.

Numerous polymer composite dielectric materials are known. For example, U.S. Pat. Nos. 4,335,180 and 5,358,775, both of which are assigned to Rogers Corporation, teach composites of fluoropolymers, preferably poly(tetrafluoroethylene) (PTFE), and ceramic materials for use as high dielectric materials. Rogers Corporation sells a product containing PTFE and a ceramic filler for use as a high dielectric film. It is however difficult to make thin films and other shaped composites of PTFE containing a filler.

U.S. Pat. No. 5,154,973 generally describes composites of thermoplastic polymers and ceramics having a high dielectric constant. German patent publication 3,242,657 describes composites of $BaTiO_3$ in poly(ethylene terephthalate). Japanese patent publication 98,069 teaches $BaTiO_3$ in poly(phenylene sulfide). Composites of high dielectric ceramics in thermosets are also known. For example, a high dielectric composite in which an epoxy resin based on bisphenol F epoxy is filled with barium titanate has been described (S. Asai, et al., IEEE Transactions on Components, Hybrids and Manufacturing Technology, Vol. 16, No. 5, August, 1993, pp. 499–504). The composites based on epoxy are easy to process before the epoxy resins set because of the low viscosity of the epoxy prepolymer. These composites have dielectric constants up to about 20.

Compositions having high dielectric constants that utilize thermoplastic polymers and are easy to fabricate without complex processing are disclosed herein. Preferred compositions also have a low loss tangent.

SUMMARY OF THE INVENTION

Polymeric compositions having a high dielectric constant comprise a thermotropic liquid crystalline polymer and a high dielectric ceramic which has a dielectric constant of at least about 50 at a frequency of 1.0 GHz. The ceramic is included in the composition in sufficient quantity that the composition has a dielectric constant of at least about 4.0 at a frequency of 1.0 GHz. The high dielectric ceramic may be a mixture of more than one ceramic having a dielectric constant of at least about 50 at a frequency of 1.0 GHz. Laminates having a high dielectric constant comprise a flat substrate that is made from the polymeric composition described above. The substrate has two surfaces, at least one of which surfaces has a layer of copper or other metal adhering to it. The laminates have a dielectric constant of at least about 4.0 at a frequency of 1.0 GHz. These laminates are made by the steps of (a) compounding a thermotropic liquid crystalline polymer and one or more ceramics having a dielectric constant of at least about 50 at 1.0 GHz to yield a polymeric composition having a dielectric constant of at least about 4.0 at a frequency of 1.0 GHz; (b) shaping the composition to yield a flat substrate; and (c) applying metal onto one or both surfaces of the substrate. By "shaping" is meant any process for making a polymer into a fabricated product, such as a film, sheet, or three-dimensional object; such processes include extrusion, injection molding, calendaring, compression molding, and the like.

DETAILED DESCRIPTION OF THE INVENTION

Ceramics suitable for use in the invention have a dielectric constant of at least about 50. Preferred ceramics have a loss tangent of less than about 0.02 at 1.0 GHz. More preferably the loss tangent of the ceramics is less than about 0.01, and most preferably less than about 0.005. Ceramics having a high dielectric constant are well known and include $TiO_2$ and many ceramics that are metal titanates, wherein the metal can be selected from Ba, Ca, Sr, Mg, Pb, Zr, Mn, Nd, Bi, Sn, and mixtures thereof. When more than one metal is used, the relative amounts can be adjusted to obtain specific dielectric properties. Preferred titanates include $SrTiO_3$, barium neodymium titanate, lead zirconium titanate, $BaTiO_3$, $CaTiO_3$ and the product resulting from the sintering of $BaTiO_3$, $SrTiO_3$, and $MgZrO_3$ in a weight ratio of about 68:28:3, referred to hereafter as barium strontium titanatelmagnesium zirconate. More preferred ceramics include $SrTiO_3$ and barium neodymium titanate. $TiO_2$ is a less preferred high dielectric filler, and is preferably included at a level of less than about 50% of the ceramic by weight, and more preferably at a level less than about 10%. Barium neodymium titanate is described in more detail in the examples. Strontium titanate is the most preferred ceramic for this purpose, having a dielectric constant of 232 at 1 GHz and a loss tangent of approximately 0.0005 at 1 GHz.

The ceramics are made by methods well known in the art. The most common method is the sintering of the metal oxides and $TiO_2$ in the stoichiometric ratio that is desired in the ceramic. See for example "Ceramic Dielectrics and Capacitors," by J. M. Herbert, Gordon and Breach Science Publishers, New York, 1985, for more details on how to make these materials. In addition, many high dielectric ceramics are commercially available.

The ceramics generally are used in the form of fine particles, preferably having an average diameter in the range of about 0.2 to about 10 microns, with an average diameter of about 1–2 microns being particularly convenient.

Thermotropic liquid crystalline polymers are the matrix for high dielectric polymeric compositions. Thermotropic liquid crystalline polymers are well known in the art. The polymer chains are relatively rigid and linear, so that the polymers melt to form a liquid crystalline phase. Thermotropic liquid crystalline polymers are particularly useful in this invention due to their low melt viscosity under conditions of high shear. This makes it possible to make shaped parts by standard methods (e.g., injection molding) even with high concentrations of ceramic filler, which are needed for making compositions with very high dielectric constants.

Generally, the polymers melt to form liquid crystalline phases at temperatures less than about 400° C. These polymers are generally condensation polymers, including aromatic polyesters, aliphatic-aromatic polyesters, aromatic poly(esterimides), aliphatic-aromatic poly(esteramides), aromatic poly(esteramides), aromatic poly(estercarbonates), aromatic polyamides, and aliphatic-aromatic polyamides. The preferred thermotropic liquid crystalline polymers are aromatic polyesters and poly(esteramides) which include one or more monomer units derived from terephthalic acid, isophthalic acid, 1,4-hydroquinone, resorcinol, 4,4'-dihydroxybiphenyl, 4,4'-biphenyldicarboxylic acid, 4-hydroxybenzoic acid, 6-hydroxy-2-naphthoic acid, 2,6-naphthalenedicarboxylic acid, 2,6-dihydroxynaphthalene, 4-aminophenol, and 4-aminobenzoic acid.

Some of the aromatic groups may include substituents which do not react under the conditions of the polymerization, such as lower alkyl groups having 1–4 carbons (e.g. methyl, ethyl, propyl, and butyl), aromatic groups, F, Cl, Br and I. The synthesis and structure of some typical aromatic liquid crystalline polyesters are taught in U.S. Pat. Nos. 4,473,682; 4,522,974; 4,375,530; 4,318,841; 4,256,624; 4,161,470; 4,219,461; 4,083,829; 4,184,996; 4,279,803; 4,337,190; 4,355,134; 4,429,105; 4,393,191; and 4,421,908. The synthesis and structure of some typical aromatic liquid crystalline poly(esteramides) are taught in U.S. Pat. Nos. 4,339,375; 4,355,132; 4,351,917; 4,330,457; 4,351,918; and 5,204,443. Aromatic liquid crystalline polyesters and poly(esteramides) are available from Hoechst Celanese Corporation under the VECTRA® trademark, Amoco Chemical Co. under the ZYDARI trademark, and from DuPont Corp.

A preferred liquid crystalline polyester comprises monomer repeat units derived from 4-hydroxybenzoic acid and 6-hydroxy-2-naphthoic acid, as taught in U.S. Pat. No. 4,161,470. Preferably, monomer units derived from 4-hydroxybenzoic acid comprise about 15% to about 85% of the polymer on a mole basis and monomer units derived from 6-hydroxy-2-naphthoic acid comprise about 85% to about 15% of the polymer on a mole basis. A preferred polymer based on these two monomers is sold as VECTRA C-Resin and comprises about 80% of monomer units derived from 4-hydroxybenzoic acid and about 20% of monomer units derived from 6-hydroxy-2-naphthoic acid. The polymer has a limited molecular weight to aid in processing. A less preferred polymer for high temperature applications based on the same two monomers comprises about 73% monomer units derived from 4-hydroxybenzoic acid and about 27% monomer units derived from 6-hydroxy-2-naphthoic acid, on a mole basis. This resin is sold as VECTRA A-resin (VECTRA A-950 in unfilled form).

A particularly preferred polyester for high temperature applications that includes these monomer units is derived from 4-hydroxybenzoic acid, 6-hydroxy-2-naphthoic acid, 4,4'-biphenol and terephthalic acid, as taught in U.S. Pat. No. 4,473,682. This polymer is sold as VECTRA E-resin by Hoechst Celanese Corporation.

A liquid crystalline poly(esteramide) that can be used in this invention comprises monomer units derived from 4-hydroxybenzoic acid, 6-hydroxy-2-naphthoic acid, terephthalic acid, 4,4'-biphenol and 4- aminophenol, as taught in U.S. Pat. No. 5,204,443; a highly preferred composition comprises these monomer units in a mole ratio of about 60:3.5:18.25:13.25:5.

The ceramic filler is included at a high enough level to yield a composition having a dielectric constant greater than about 4.0, preferably greater than about 6.0, and more preferably greater than about 10 at a frequency of 1.0 GHz. The loss tangent of the composition and shaped articles made from the composition, including laminates, is preferably less than about 0.02 at a frequency of 1.0 GHz, more preferably less than about 0.01, and most-preferably less than about 0.005.

The amount of ceramic in the polymeric composition is generally in the range of about 10% to about 70% by volume. The polymeric compositions can also include other solid or reinforcing fillers, as well as sizing or coupling agents, antioxidants, mold lubricants, and the like. Examples of these fillers include carbon, wollastonite, mica, talc, silicates, silica., clay, poly(tetrafluoroethylene), alumina, glass, rock wool, silicon carbide, diamond, fused quartz, aluminum nitride, boron nitride, and beryllium oxide, all in either particle or fiber form. These fillers can be included in amounts such that the total amount of filler and high dielectric ceramic is in the range of about 10% to about 70% by volume. The added filler that is used will be selected based on desired physical properties as well as the desired dielectric constant and loss tangent. The use of some of these (e.g., carbon) may be limited by their detrimental effect on the loss tangent or dielectric constant.

The compositions are made by methods well known in the art. The preferred method is by compounding the ceramic powder with the liquid crystalline polymer in the melt phase in a mixer, such as an extruder. Twin screw extruders are most commonly used. The compound of liquid crystalline polymer is then extruded and pelletized. The pellets can be stored and then dried and melted again for further fabrication.

The compounds of ceramic powder and polymer are made into sheets, films, and other shapes by standard processes, such as extrusion, compression molding, and calendaring. Thicker molded parts, such as plaques (for printed circuit boards) are most conveniently made by injection molding, though other standard methods may also be used, such as compression molding.

The high dielectric materials are often used in the form of flat substrates, which may be in the form of sheets, films, plaques, disks, and the like, sandwiched between two layers of metal, which is usually copper. These multilayer constructions are referred to as "laminates," whether or not the metal layers have been laminated onto the flat substrates. In addition, the laminates may be stacked and interconnected to give more complex arrangements of layers, where the layers may have different dielectric constants and different thicknesses, to form substrates for multichip modules and circuit boards.

The laminates have a layer of metal adhering to at least one side of the substrate, and generally to both sides. The metal is present as an electrical conductor. Copper is the preferred metal, but other metals, such as gold, titanium, silver, and alloys thereof or with copper, may also be used. The thickness of the substrate generally will be in the range of about 1 mil to about 500 mils. The metal layers, if in the form of foils that have been laminated onto the substrate, will have a thickness in the range of about ⅛ mil to about 12 mils. Typical foils currently have a thickness of about ½ mil to about 6 mils. Metal foils may be laminated onto the substrate by sticking them to the melted polymer or by use of an adhesive. Thin metal layers may also be applied by other processes than lamination, such as vapor deposition or sputtering. Metal may also be applied by electroplating, in which case the substrate is composed of a thermotropic liquid crystalline polymer that has been specially formulated to make it suitable for electroplating. The preferred method of applying a metal coating is by lamination of a metal film or foil. The preferred metal foils or films have a matte surface on one side to facilitate adhesion between the metal and polymer. Foils can be obtained in which the matte surface has a surface profile with an arithmetic mean roughness value of about 1 micron and a mean peak to valley height of about 10 microns. Treated films with larger roughness factors are also available. The films with larger roughness values give better adhesion and are therefore preferred.

The high dielectric composites and laminates have many uses. For example, sheets, films, plaques and the like may all be used as substrates for making printed circuit boards that are useable at microwave frequencies. Other uses for flat substrates include high energy density capacitors, filters, antennas, buried components and multichip modules. An application for which these materials are particularly useful is printed circuit antennas, such as dipole, microstrip, and patch antennas, for wireless equipment. These kinds of antennas are typically flat because the substrate is a ceramic, and their emitted signals are therefore directional. These materials can easily be made in curved or other shaped forms so that the directionality can be modified as desired. Other applications include printed (stripline or microstrip) rf and microwave circuit elements, such as transmission lines, inductors, capacitors, filters (e.g., low pass filters, high pass filters, band pass filters, and band stop filters), signal couplers, branch line couplers, power splitters, signal splitters, impedance transformers, half wave and quarter wave transformers, and impedance matching circuits.

The invention is further illustrated by the following non-limiting examples.

EXAMPLES 1–3

Compounds of three different ceramics in VECTRA® E950 LCP resin from Hoechst Celanese Corporation were made by combining pellets of the E950 resin, which had been dried in air at 110° C. for 12–15 hours, with the dried ceramic powder in a HAAKE™ or BERSTORFF™ melt mixer at 360°–370° C. These composite materials were then extruded or molded into sheets, films and discs for testing.

Three ceramic materials were compounded with the VECTRA® E950 resin:

(1) Lead zirconium titanate (PZT), obtained from Hoechst CeramTec in Germany under the name SONEX™P52 as a powder with most of the particles in the range of about 1 to about 5 microns. PZT has a dielectric constant of about 1000 and a loss tangent of about 0.001 at 1 KHz.

(2) TICON®55 strontium titanate powder, obtained from Tam Ceramic Co., Niagara Falls, N.Y. The particle size range is about 0.2 microns to about 10 microns. The average particle size is about 1–2 microns.

(3) Barium neodymium titanate, obtained from Tam Ceramic Co., Niagara Falls, N.Y., under the designation COG900MW. The particle size is about 0.2 microns to about 10 microns. The dielectric constant of the powder is about 92 at 1.0 GHz, and the loss tangent is about 0.001 at 1.0 GHz. The commercial ceramic has an approximate atomic ratio of Ba:Nd of 1, with a small amount of bismuth (<10% compared with Ba or Nd), and enough Ti to achieve the titanate stoichometry.

Dielectric/Loss Properties

Compounds of the three ceramic materials were made at the loadings shown in Table 1. These compounds were made into discs (⅛" thickness X 2"–2½" diameter) by injection molding using a BOY30M injection molding machine.

The dielectric constants ($D_k$) and loss tangents (tan δ) of these discs were measured as a function of frequency. The dielectric constants and loss tangents at 1 MHz were measured using a Hewlett Packard HP 4192A LF impedence analyzer and HP 16451B dielectric fixture. The dielectric constants and dissipation factors at 1 and 2 GHz were measured by the cavity resonance technique according to ASTM Test Method No. D2520, Method B.

TABLE 1

Ceramic Composites in VECTRA E950 LCP

| Example No. | Ceramic | Volume %[4] | Weight %[4] |
|---|---|---|---|
| 1 | PZT[1] | 30% | 69.4% |
| 2 | Strontium Titanate[2] | 48% | 75.0% |
| 3 | Barium Neodymium Titanate[3] | 43% | 75.0% |

[1]Lead zirconium titanate from Hoechst CeramTec (SONEX ™ P52)
[2]TICON 55 $SrTiO_3$
[3]COG900MW from Tam Ceramics, Niagara Falls, NY.
[4]Balance is LCP resin.

TABLE 2

Dielectric/Loss Properties of Ceramic Composites

| | Dielectric constant | | | Loss Tangent | | |
|---|---|---|---|---|---|---|
| Example | 1 MHz | 1 GHz | 2 GHz | 1 MHZ | 1 GHZ | 2 GHZ |
| 1 | 20.0 | 19.8 | 20.1 | 0.02 | 0.0153 | 0.0202 |
| 2 | 18.8 | 18.2 | 18.1 | 0.02 | 0.0039 | 0.0034 |
| 3 | 12.4 | 12.1 | 12.0 | 0.02 | 0.0030 | 0.0026 |

EXAMPLE 4

A series composites consisting of differing amounts of TICON 55 strontium titanate powder in VECTRA E950 LCP resin were made by the melt blending methods described previously. These were molded into disks, and the average dielectric constants were measured at 1.0 MHz. These are averages because the molded articles exhibit anisotropy in their dielectric properties. The data are shown in Table 3. The dielectric constant at 1.0 GHz of the sample with 48% by volume of $SrTiO_3$ is 18.2. The data approximately (but not exactly) follow the predictions of the Maxwell Garnet theory. For comparison, the dielectric constant of the unfilled resin is about 3.3 at 1.0 Ghz.

TABLE 3

Effect of Ceramic Content on Dielectric Constant

| Volume % of Strontium Titanate in VECTRA E950 LCP | Dielectric Constant at 1.0 MHz |
|---|---|
| 23.3 | 6.9 |
| 30 | 8.2 |
| 36 | 11.0 |
| 40 | 13.5 |
| 48 | 18.7 |

EXAMPLE 5

Sheets (about 30 mils in thickness) were made from compounds of 30% and 35% by volume of TICON 55 strontium titanate in VECTRA E950 LCP resin by extruding the compound through 4-inch and 8-inch wide output dies. Sheets having the best appearance were obtained when the temperature of the output die was slightly less than the polymer melt temperature.

Molded plaques having dimensions of 6"×6"× either 1/8" or 1/16" were made by the injection molding of compounds of 30% and 40% by volume of TICON 55 strontium titanate in VECTRA E950 LCP resin. The molding was carried out in a DEMAG injection molding machine. It was observed that the molded parts became more brittle as the amount of strontium titanate in the composite increased. The 1/8" thick injection molded plaques were more brittle along the flow direction, indicating that the filled LCP resins were exhibiting typical LCP anisotropy. The thinner (1/16" thick) plaques were less brittle but did not survive a drop test. The dielectric constant ($D_k$) of the sheets and plaques were measured for comparison. The $D_k$ of the extruded sheet containing 30% $SrTiO_3$ was about 6.0–7.0, whereas the $D_k$ of the molded plaque containing 30% $SrTiO_3$ was about 9.0. The extruded sheets appeared to have some porosity. The porosity of extruded sheet can be eliminated by changing the processing conditions, such as the output die pressure, and by adding other fillers.

EXAMPLE 6

For many applications, such as capacitors, the high dielectric composites will be used as films, sheets, plaques, or the like laminated between two layers of copper film. Laminates are made by several procedures, including the following:

(a) Lamination of molded plaques.

Pieces of molded composite sheet (1/16 inch thick) consisting of VECTRA E950 resin or a polyesteramide resin made from 60% 4-hydroxybenzoic acid, 3.5% 6-hydroxy-2-naphthoic acid, 18.25% 4,4"-biphenol, 13.25% terephthalic acid, and 5% 4-aminophenol, according to U.S. Pat. No. 5,204,443, compounded with a ceramic filler were sandwiched between two pieces of copper foil. The copper foil was obtained from Gould Inc., Foil Division, Eastlake, Ohio, and was supplied as JTC Grade 1. Experiments were carried out using samples of both 1/2 ounce and one ounce copper foil, having a thickness of about 18 microns and 35 microns, respectively. The foil had a matte surface on one side to improve adhesion, with a surface profile having an arithmetic mean roughness value of about 1 micron and a mean peak to valley height of about 10 microns. The three layers (copper and foil) were placed under a pressure of about 55 psi under a vacuum (less than 100 Torr) in a static vacuum press and slowly heated over 50 minutes to 340°–345° C., approximately the melt temperature of the polymer. The system was then cooled back down to about 65° C. over a time of about 20 minutes. Copper adhesion was measured to be about 0.5 to 1.8 pounds/inch when a 1-inch wide strip of copper was peeled away from the substrate at a 180° angle to the surface (parallel to the surface) at a speed of 1/2 inch/minute. The higher adhesion was achieved at the higher lamination temperature (about 345° C.).

(b) Electroplating.

LCP resins can be obtained which contain surface activating agents, such as calcium pyrophosphate. The surface activating agents facilitate the electroplating of metals. In this way, thin films of copper can be electroplated onto surface-activated LCP disks or films. Peel strengths of about 5 pounds/inch have been obtained.

(c) Use of an adhesive.

Copper film, such as that used in (a) above, can also be attached to the LCP resin discs or films by using an adhesive. An adhesive that worked particularly well is C-FLEX™, obtained from Courtalds Performance Films Co.

It is to be understood that the above embodiments of the invention are illustrative only and that modification throughout may occur to one skilled in the art. Accordingly, this invention is not to be regarded as limited to the embodiments disclosed herein.

We claim:

1. A polymeric composition having a high dielectric constant comprising a thermotropic liquid crystalline polymer and a high dielectric ceramic in the form of fine particles having an average diameter of from about 0.2 to about 10 microns selected from the group consisting of $SrTiO_3$, barium neodymium titanate, and mixtures thereof, wherein said high dielectric ceramic is included in an amount of at least about 30% by volume and in sufficient quantity that said composition has a dielectric constant of at least about 6.0 at a frequency of 1.0 GHz.

2. The polymeric composition as recited in claim 1, wherein said composition has a loss tangent of less than about 0.02 at 1.0 GHz.

3. The polymeric composition recited in claim 1, wherein said composition has a loss tangent of less than about 0.01 at 1.0 GHz.

4. The polymeric composition as recited in claim 1, wherein said high dielectric ceramic is $SrTiO_3$.

5. The polymeric composition as recited in claim 1, wherein said thermotropic liquid crystalline polymer comprises monomer units derived from one or more monomers selected from the group consisting of 4-hydroxybenzoic acid, 6-hydroxy-2-naphthoic acid, 2,6-naphthalenedicarboxylic acid, terephthalic acid, isophthalic acid, 1,4-hydroquinone, 4,4"-biphenol, 4-aminophenol, 4,4"-biphenyidicarboxylic acid, and 4-aminobenzoic acid.

6. The polymeric composition as recited in claim 1, wherein said high dielectric constant ceramic is included in said composition in an amount of about 30% to about 50% by volume.

7. The polymeric composition as recited in claim 1, said composition further comprising one or more solid or reinforcing fillers.

8. The polymeric composition as recited in claim 7, wherein said solid or reinforcing fillers are selected from the group consisting of carbon, wollastonite, mica, talc, silicates, silica, clay, poly(tetrafluoroethylene), alumina, glass, rock wool, silicon carbide, diamond, fused quartz, aluminum nitride, beryllium oxide, boron nitride, and mixtures thereof, where said fillers are particles, fibers, or mixtures thereof.

9. A high dielectric constant laminate comprising:

(a) a flat substrate comprising a polymeric composition having a high dielectric constant, said substrate having two surfaces, said polymeric composition comprising a thermotropic liquid crystalline polymer and a high dielectric ceramic in an amount of at least about 30% by volume and in the form of fine particles having an average diameter of from about 0.2 microns to about 10 microns selected from the group consisting of $SrTiO_3$, barium neodymium titanate, and mixtures thereof; and (b) one or more layers of metal, each layer adhering to one surface of said substrate;

wherein said laminate has a dielectric constant of at least about 6.0 at a frequency of 1.0 GHz.

10. The high dielectric constant laminate as recited in claim 9, wherein said high dielectric constantceramic is $SrTiO_3$.

11. The high dielectric constant laminate as recited in claim 9, wherein said laminate has a loss tangent of not more than about 0.02 at 1.0 GHz.

12. The high dielectric constant laminate as recited in claim 9, wherein said metal is copper.

13. A high dielectric constant laminate as recited in claim 12, wherein the thickness of said substrate is in the range of about 30 mils to about 500 mils, and the thickness of said copper layer is in the range of about ⅛ mil to about 12 mils.

14. A high dielectric constant laminate as recited in claim 12, said laminate comprising a flat substrate of said polymeric composition and two layers of copper, said polymeric composition comprising about 30% to about 50% by volume of said ceramic.

15. A method of making a laminate having a high dielectric constant, comprising the steps of:

(a) compounding a thermotropic liquid crystalline polymer and a ceramic in an amount of at least about 30% by volume and in the form of fine particles having an average diameter of from about 0.2 to about 10 microns selected from the group consisting of $SrTiO_3$, barium neodymium titanate, and mixtures thereof to yield a polymeric composition having a dielectric constant of at least about 6.0 at 1.0 GHz;

(b) shaping said polymeric composition to form a flat substrate; and (c) applying metal onto one or both surfaces of said substrate.

16. A method of making a laminate having a high dielectric constant as recited in claim 15, wherein said step of applying metal to one or both surfaces of said substrate is carried out by laminating metal foil onto one or both surfaces of said substrate.

17. A method of making a laminate as recited in claim 16, wherein said metal is copper.

18. The method of making a laminate as recited in claim 15, wherein said laminate has a dielectric constant of at least about 6 at a frequency of 1 GHz and a loss tangent of not more than about 0.01 at a frequency of 1 GHz.

19. A capacitor comprising the polymeric composition recited in claim 1.

20. A multichip module comprising the polymeric composition recited in claim 1.

21. A printed circuit antenna comprising the polymeric composition recited in claim 1.

22. A printed rf or microwave circuit element comprising the polymeric composition recited in claim 1.

23. A printed rf or microwave circuit element as recited in claim 22, where said rf or microwave circuit element is selected from the group consisting of transmission lines, inductors, capacitors, filters, signal couplers, branch line couplers, power splitters, signal splitters, impedance transformers, half wave and quarter wave transformers, impedance matching circuits, and mixtures thereof.

* * * * *